United States Patent [15] 3,691,444

Juroff et al. [45] Sept. 12, 1972

[54] REMOTE CONTROLLED TELEVISION TUNER MOTOR SWITCHING CIRCUIT

[72] Inventors: Lyle Bruce Juroff, Greenwood; Lawrence Mark Lunn, Indianapolis, both of Ind.

[73] Assignee: RCA Corporation

[22] Filed: Oct. 12, 1971

[21] Appl. No.: 188,068

Related U.S. Application Data

[62] Division of Ser. No. 36,149, May 11, 1970, Pat. No. 3,648,135.

[52] U.S. Cl. ....................318/467

[51] Int. Cl. ....................A05d 3/00

[58] Field of Search ....................318/16, 467; 325/37

[56] References Cited

UNITED STATES PATENTS

| | | | |
|---|---|---|---|
| 2,897,354 | 7/1959 | Bourget et al. | 318/16 X |
| 2,930,955 | 3/1960 | Bourget et al. | 318/467 X |
| 2,947,812 | 8/1960 | Parmet et al. | 325/37 |
| 3,179,907 | 4/1965 | Brand et al. | 318/467 X |

*Primary Examiner*—Bernard A. Gilheany
*Assistant Examiner*—F. E. Bell
*Attorney*—Eugene M. Whitacre

[57] ABSTRACT

A remote controlled television receiver includes a VHF and a UHF tuner each having tunable resonant circuits which are adjusted by the gear train of a remotely controlled motor. The tuners are connected so that during UHF operation the VHF tuner provides amplification of the UHF tuner IF signal output. A relay switch is operatively connected to the VHF motor to control the motor energization. Switch means are coupled to the VHF tuner motor gear train and provide an indication when the VHF tuner is adjusted for amplification of the UHF tuner IF signal output. A bistable multivibrator is coupled to the switch means in a manner so that the multivibrator changes states in response to the switch indication. A relay winding current control means responds to the change in state to prevent current from flowing into the relay winding. This causes the relay switch to open and de-energizes the VHF motor. A second relay switch is operatively connected to the UHF motor to control the motor energization. A second relay current control means is connected to permit a flow of current through the second relay winding only when the switch indication is present.

7 Claims, 1 Drawing Figure

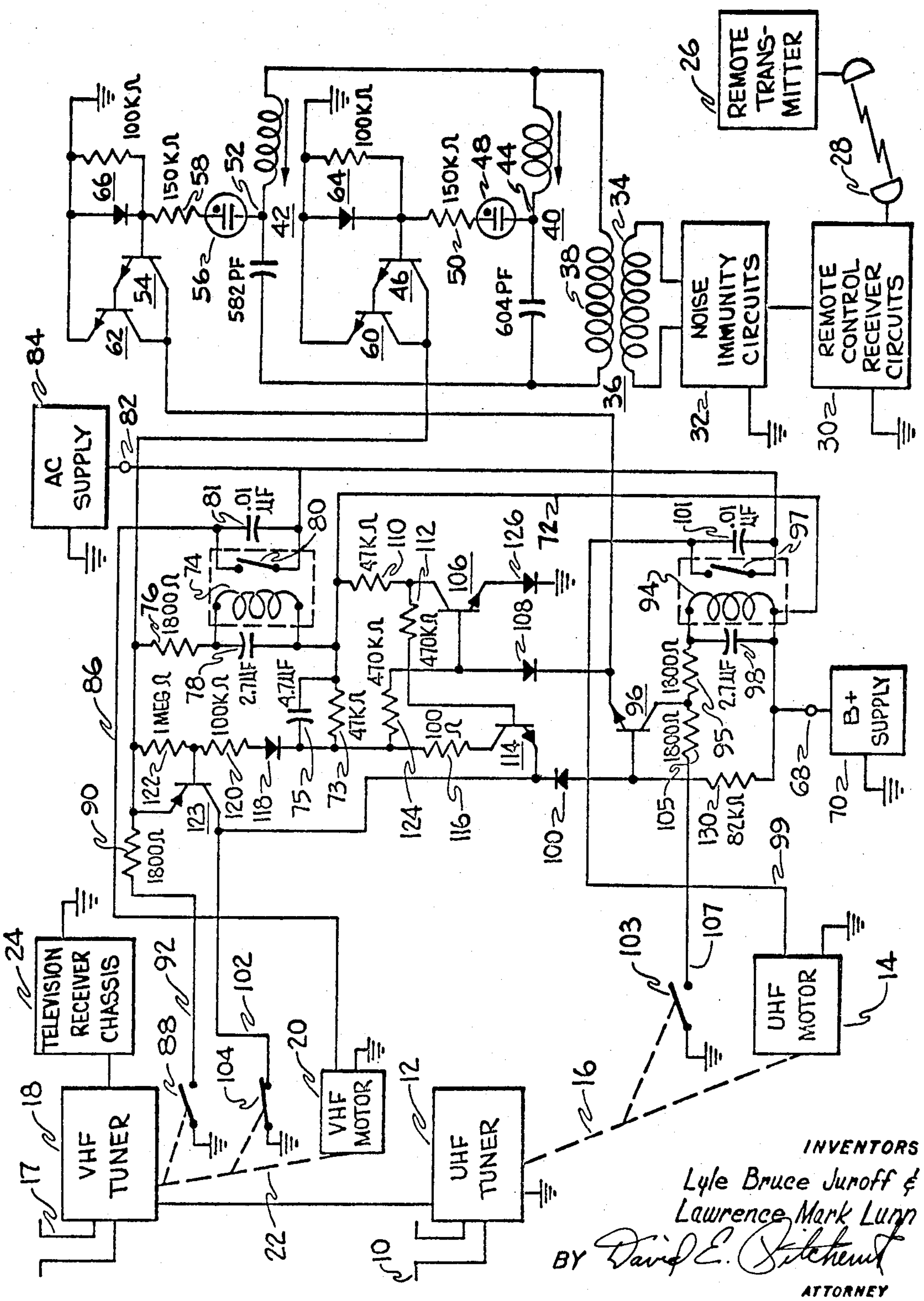
INVENTORS
Lyle Bruce Juroff & Lawrence Mark Lunn
BY David E. Pitchenik
ATTORNEY

REMOTE CONTROLLED TELEVISION TUNER MOTOR SWITCHING CIRCUIT

This application is a division of application, Ser. No. 36,149, now U.S. Pat. No. 3,648,135 filed May 11, 1970, entitled, "Remote Controlled Television Tuner Motor Switching Circuit," and assigned to RCA Corporation.

The present invention relates to remote controlled television tuner motor switching circuits, and more particularly, to a circuit for controlling the operation of the motor drive to a remote controlled VHF and UHF television tuner.

Television tuners generally include an RF amplifier or preselector stage, a local oscillator stage, and a mixer stage. Received signals are processed in the preselector or RF amplifier stage to be heterodyned in the mixer stage with locally generated signals from the oscillator stage to produce an intermediate frequency output signal. Where UHF and VHF tuners are provided, the intermediate frequency output signal from the UHF tuner is applied to the VHF tuner which is switched to a condition to provide amplification of the UHF tuner IF signal output. Thus, the VHF tuner either converts received VHF signals to IF signals or amplifies IF signals from the UHF tuner.

When the television receiver is manually operated, the operator adjusts the VHF television tuner for UHF IF signal amplification and thereafter tunes the UHF television tuner to the desired channel. Where the television tuners are remotely controlled, this operation can be achieved by first remotely adjusting the VHF tuner for UHF IF signal amplification and thereafter independently remotely tuning the UHF tuner to the desired channel. It is desirable, for ease in tuning, to automatically cause the VHF tuner to be tuned to provide UHF IF signal amplification whenever the UHF tuner is remotely actuated. One remote controlled system which operates in this manner is described in RCA Television Service Data, File 1969 No. T17. Copies of the Television Service Data may be obtained from RCA Sales Corporation, 600 North Sherman Drive, Indianapolis, Ind. 46206.

Although systems of the type described in the Television Service Data work quite satisfactorily, they utilize complex mechanical switching and relay arrangements which require extensive wiring connections between the television chassis, tuner, motor and switches. Moreover, each switch must be carefully positioned, aligned and secured to avoid excessive wear and friction. It is desirable to simplify the switching and relay arrangements. This not only reduces the number of switches which must be positioned, aligned and secured, but reduces the wiring complexity and minimizes the number of hand solder connections. It is additionally desirable to facilitate the utilization of printed circuit techniques to permit machine insertion of components and eliminate as many hand operations as is possible.

A remote controlled television receiver embodying the present invention includes a VHF and a UHF tuner each having tunable resonant circuits which are adjusted by the gear train of a remotely controlled motor. The tuners are connected so that during UHF operation the VHF tuner provides amplification of the UHF tuner IF signal output. A relay switch is operatively connected to the VHF motor to control the motor energization. Switch means are coupled to the VHF tuner motor gear train and provide an indication when the VHF tuner is adjusted for amplification of the UHF tuner IF signal output. A bistable multivibrator is coupled to the switch means in a manner so that the multivibrator changes states in response to the switch indication. A relay winding current control means responds to the change in state to prevent current from flowing into the relay winding. This causes the relay switch to open and de-energizes the VHF motor.

A complete understanding of the present invention may be obtained from the following detailed description of the specific embodiment thereof, when taken in conjunction with the accompanying drawings, in which:

The single FIGURE is a schematic circuit diagram, partly in block form, of a remote controlled VHF and UHF television tuner system including switching circuits embodying the present invention.

Referring now to the drawing, an antenna 10 for intercepting television signals in the UHF band (470–890 MHz) is coupled to a UHF tuner 12. The UHF tuner 12 includes tunable resonant circuits, not shown, which are adjusted to be tuned to different frequencies by a motor 14 and its associated drive shaft and gear train 16.

A second antenna 17 for intercepting VHF television signals is coupled to a VHF tuner 18. The VHF tuner includes tunable resonant circuits, not shown, which are adjusted to be tuned to different frequencies by a motor 20 and its associated drive shaft and gear train 22. The VHF tuner may be adjusted to be tuned to any one of the channels within the VHF television band (54–216 MHz) or to be adjusted to amplify IF signals from the UHF tuner 12. The VHF tuner 18 thus either operates to convert received VHF signals to an IF signal which is applied to the television receiver chassis 24 or amplifies IF signals from the UHF tuner 12 which is thereafter coupled to the television receiver chassis 24.

For remote controlled operation, a transmitter 26, which may be of the hand-held variety, transmits a control signal wave at one of several predetermined frequencies. The signal is received by the remote control pickup device 28 and conveyed to remote receiver circuits 30 to be amplified. The amplified control signals are passed through a noise immunity circuit 32 and applied to the primary winding 34 of a transformer 36 to be inductively coupled to the transformer's secondary winding 38.

Two series resonant circuits 40 and 42 are connected across the secondary winding 38. The value of the components of the two series tuned circuits are apportioned such that the circuits are resonant at 40.25 KHz and 41.75 KHz, respectively. Each series resonant circuit junction is connected to the base of a transistor by the series combination of a neon tube and a resistor. Thus, junction 44 is connected to the base electrode of a transistor 46 by a neon tube 48 and a resistor 50; and junction 52 is connected to the base electrode of a transistor 54 by a neon tube 56 and a resistor 58. To provide increased current handling capability, each of the transistor 46 and 54 are connected in Darlington configuration with another transistor, transistors 60–62.

When a selected one of the series resonant circuits 40 and 42 is energized at its resonant frequency by signals from the secondary winding 38, a large voltage is developed at the junction of the inductor and capacitor comprising the series resonant circuit. When the junction voltage has risen to approximately 160 volts peak-to-peak, the neon tube connected to the junction becomes actuated or ignited.

Once the neon tube is actuated, the Darlington connected transistors are biased into conduction. The base to emitter current path for the transistors provides the current path to ground for the neon tube current flow during positive half cycles, and during negative half cycles, the neon tube current path to ground is through one of the parallel resistor-diode circuits 64 or 66. The neon tube switching arrangement is described in greater detail in a U.S. Patent application entitled, "Threshold Digital Switch Circuit for Remote Control Systems," Ser. No. 818,222, filed Apr. 22, 1969, in the name of Lyle Bruce Juroff. The application is assigned to RCA Corporation.

To cause the VHF motor 20 to become energized and rotate motor shaft and gear train 22, the remote transmitter 26 is actuated to transmit a signal which will cause the transistors 46 and 60 to be biased into conduction. Conduction of the transistors 46 and 60 provides a current path between a terminal 68, energized by a B+ supply 70, through lead 72, a relay winding 74, a current limiting resistor 76 and the collector-emitter current path of the transistors to ground. A capacitor 78 is connected in parallel with the relay winding 74 to prevent the voltage at the collector electrode of transistors 46–60 from rising too rapidly after the transistors turn off.

The flow of direct current through the relay winding 74 causes the relay switch 80 to close and provide a low impedance path from a terminal 82, energized by an AC supply 84, through the relay switch 80 and a lead 86 to the VHF motor 20. A capacitor 81 is connected in parallel with the relay switch 80 to prevent arcing between the relay switch contacts. The application of the AC potential to the VHF motor 20 energizes the motor and causes the motor shaft and gear train 22 to rotate. The rotation of the motor shaft and gear train 22 closes a switch 88 and maintains it closed until the VHF tuner is adjusted to tune the next succeeding channel. The switch 88, when closed, provides an additional current path from the terminal 68 through the relay winding 74 and current limiting resistor 76 to ground via a resistor 90 and the lead 92. The switch 88 insures that once VHF motor 20 becomes energized it will remain energized until the VHF tuner's tunable resonant circuits are tuned to the next succeeding channel, even if the transistors 46 and 60 are only momentarily conductive. Should the transistors 46 and 60 remain conductive because of a continuous signal being transmitted by the remote transmitter 26, the VHF motor 20 will remain energized causing the motor shaft and gear train 22 to rotate until the transistors become non-conductive and switch 88 opens.

To cause the UHF motor 14 to become energized and rotate motor shaft and gear train 16, the remote transmitter 26 is actuated to transmit a signal which will cause the transistors 54 and 62 to be biased into conduction. When the transistors 54 and 62 are conductive, a current path exists between the terminal 68, energized by the B+ supply 70, through a relay winding 94, a current limiting resistor 95, and the collector-emitter current path of a transistor 96 (when biased for conduction) and the collector-emitter current path of the transistors 54–62 to ground. A capacitor 98 is connected in parallel with the relay winding 94 to prevent the voltage at the collector electrode of the transistors 54–62 from rising too rapidly after the transistors are turned off.

The flow of direct current through the relay winding 94 causes the relay switch 97 to close and provide a low impedance path from the terminal 82, energized by the AC supply 84, through the relay switch 97, and a lead 99 to the UHF motor 14. A capacitor 101 is connected in parallel with relay switch 80 to prevent arcing between the relay switch contacts. The application of the AC potential to the UHF motor 14 energizes the motor and causes the motor shaft and gear train 16 to rotate. The rotation of the motor shaft and gear train 16 closes a switch 103 and maintains it closed until the UHF tuner is adjusted to tune the next succeeding channel. The switch 103, when closed, provides an additional current path from the terminal 68 through the relay winding 94 and the current limiting resistor 95 to ground via a resistor 105, and the lead 107. The switch 103 insures that once the UHF motor 14 becomes energized it will remain energized until the UHF tuner's tunable resonant circuits are tuned to the next succeeding channel, even if the transistors 54 and 62 are only momentarily conductive. Should the transistors 54 and 62 remain conductive because of a continuous signal being transmitted by the remote transmitter 26, the UHF motor 14 will remain energized causing the motor shaft and gear train 16 to rotate until the transistors become non-conductive and switch 103 opens.

The transistor 96 is biased into conduction only when the VHF tuner 18 is adjusted to amplify IF signals from the UHF tuner 12. Where the VHF tuner 18 is not adjusted to provide IF signal amplification of the UHF tuner output signal, the collector-emitter current path of the transistor 96 is non-conductive and no current can flow from the terminal 68 through the relay winding 94 even though transistors 54–62 are biased into conduction. Consequently, the relay switch 97 will be open and the UHF motor 14 will not be energized. The base electrode of the transistor 96 is connected to ground by a DC blocking diode 100, lead 102 and a switch 104. The switch, shown in the closed position, is mechanically coupled to the VHF motor drive shaft and gear train 22. The switch 104 is maintained in a closed position when the VHF tuner is adjusted to tune any of the channels within the VHF television band and in an open position when the VHF tuner is adjusted to amplify IF signals from the UHF tuner 12. With switch 104 closed, the base electrode of the transistor 96 is maintained at a low potential and the transistor's collector-emitter current path is non-conductive. Thus, no current can flow from the terminal 68 through the relay winding 94 with switch 104 closed.

The conduction of the transistors 54–62 connects the base electrode of a transistor 106 to ground through a DC blocking diode 108 and the collector-emitter current path of transistors 54–62. This biases the transistor 106 to be non-conductive and the voltage at its collector electrode which is coupled to the terminal 68 via the resistor 110 and lead 72 rises. The voltage at the collector electrode of transistor 106 is coupled by means of a resistor 112 to the base electrode of a transistor 114 which biases the transistor 114 into conduction. Under quiescent conditions, transistor 106 is biased for conduction of the transistor's collector-emitter current path. Operating potential for the collector electrode of the transistor 114 is obtained from the terminal 68 through lead 72, a resistor 73 and a resistor 116. A capacitor 75 is connected in parallel with resistor 73. This capacitor insures that under quiescent conditions when the B+ supply 70 is turned on, the transistors 106 and 114 will be biased with transistor 106 conductive and transistor 114 non-conductive. This occurs because capacitor 75, when discharged, provides a low impedance path to apply the voltage to the base electrode of transistor 106 before it is applied to the base electrode of transistor 114.

With switch 104 closed and transistor 114 biased into conduction, the base electrode of a PNP transistor 123 is connected to ground through the resistor 120, the DC blocking diode 118, the resistor 116, the collector-emitter electrode current path of transistor 114 and switch 104. This biases the collector-emitter current path of the transistor 123 into conduction and a current will flow from the terminal 68 through the lead 72, the relay winding 74, the resistor 76, the transistor 123 and the switch 104 to ground. The current flow through the relay winding 74 causes the relay switch 80 to close and the VHF motor 20 to be energized. The VHF motor will remain energized and rotate motor shaft and gear train 22 until the VHF tuner's tunable resonant circuits are adjusted to amplify IF signals from the UHF tuner 12. At this time, the switch 104 opens and the current flow through the relay winding 74 ceases. The relay switch 80 opens and the VHF motor 20 is de-energized.

When switch 104 opens, the transistors 114 and 123 become non-conductive, and the voltage at the junction of the resistor 116 and the DC blocking diode 118 rises. The voltage is coupled to the base electrode of the transistor 106 by resistor 124 to bias the transistor back into conduction. A diode 126 is connected in series with the emitter electrode of the transistor and ground to raise the voltage required to bias the transistor into conduction to provide a more pronounced transition between the conduction and non-conduction conditions. The non-conduction of transistor 114 also causes the voltage at the base electrode of transistor 123, the junction of resistors 120 and 122, to rise. At this time, the base electrode of the transistor 96 is no longer maintained at a low potential through the DC blocking diode 100 and switch 104. A voltage is applied to the base electrode of transistor 96 from the terminal 68 through a resistor 130 to bias the transistor into conduction. With transistor 96 biased for conduction, actuation of the remote transmitter 26 to transmit a signal which will cause transistors 54 and 62 to be biased into conduction, completes the relay winding 94 current path. This causes relay switch 97 to close and energize the UHF motor 14. The motor shaft and gear train 16 rotate until the UHF tuner's tunable resonant circuits are tuned to the next succeeding channel.

What is claimed is:

1. In a remote controlled television receiver of the type including a VHF and a UHF tuner each having tunable resonant circuits adjusted by the gear train of a remotely controlled motor and wherein during UHF operation, the VHF tuner is adjusted to provide amplification of the IF signal output from the UHF tuner, a motor switching system comprising:

relay means including a relay winding and a relay switch, said relay switch operatively connected to said VHF motor to control said motor energization;

relay winding current control means for controlling the flow of current through said relay winding;

switch means coupled to said VHF tuner motor gear train, said switch means providing an indication when said VHF tuner is adjusted to provide amplification of the IF signal output from said UHF tuner;

a bistable multivibrator having two stable states;

said multivibrator coupled to said switch means such that said multivibrator changes from a first to a second state in response to said switch indication that said VHF tuner is adjusted to provide amplification of the IF signal output from said UHF tuner; and said relay winding current control means responsive to said change in multivibrator state to prevent current from flowing into said relay winding so that said relay switch opens and de-energizes said VHF motor.

2. A motor switching system as defined in claim 1 including second relay means having a relay winding and a relay switch operatively connected to said UHF motor to control said motor energization, and second relay winding current control means for controlling the flow of current through said second relay winding, said second current control means operative to permit a flow of current through said winding only when said switch means indication is present.

3. A motor switching system as defined in claim 2 including a second switch means coupled to said VHF tuner motor gear train, said second switch connected in parallel with said relay winding current control means to provide a second current path for said relay winding.

4. A motor switching system as defined in claim 3 including a third switch means coupled to said UHF tuner motor gear train, said third switch connected in parallel with said second relay winding control means to provide a second current path for said second relay winding.

5. A motor switching system as defined in claim 2 including a three terminal device having a first, a second and a control electrode, means coupled to said control electrode to bias said device first-second electrode current path for conduction when signals of a predetermined frequency are remotely transmitted, said device first-second electrodes connected in a series with said relay winding between a source of DC potential and a fixed reference potential.

6. A motor switching system as defined in claim 5 including a second three terminal device having a first, a second and a control electrode, means coupled to said control electrode to bias said device first-second electrode current path for conduction when signals of a second predetermined frequency are remotely transmitted, said device first-second electrodes connected in series with said second relay winding between said source of DC potential and a fixed reference potential.

7. A motor switch system as defined in claim 6 wherein said second three terminal device is coupled to said multivibrator to cause said multivibrator to change states when said device is biased for first-second electrode current path conduction and said switch means indication is not present.

* * * * *